United States Patent
Lee et al.

(10) Patent No.: US 8,008,653 B2
(45) Date of Patent: Aug. 30, 2011

(54) RESISTIVE ORGANIC MEMORY DEVICE AND FABRICATION METHOD THEREOF

(75) Inventors: Kwang Hee Lee, Suwon-si (KR); Tae Lim Choi, Seongnam-si (KR); Won Jae Joo, Hwaseong-si (KR); Sang Kyun Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 879 days.

(21) Appl. No.: 11/633,020

(22) Filed: Dec. 4, 2006

(65) Prior Publication Data

US 2007/0194288 A1 Aug. 23, 2007

(30) Foreign Application Priority Data

Feb. 22, 2006 (KR) .................. 10-2006-0017154

(51) Int. Cl.
*G11C 11/34* (2006.01)

(52) U.S. Cl. ... 257/40; 365/129; 365/148; 257/E51.008; 257/E51.044

(58) Field of Classification Search .............. 365/148, 365/151–153, 159, 163, 174, 129, 145, 167; 438/99; 257/40, E51.001–E51.003, E51.008–E51.011, 257/E51.023, E51.041, E51.044
See application file for complete search history.

(56) References Cited

U.S. PATENT DOCUMENTS

| | | | | |
|---|---|---|---|---|
| 3,833,894 A | * | 9/1974 | Aviram et al. | 365/151 |
| 5,416,170 A | * | 5/1995 | Rhee et al. | 524/398 |
| 6,208,553 B1 | * | 3/2001 | Gryko et al. | 365/151 |
| 2002/0149809 A1 | * | 10/2002 | Jackson | 359/107 |
| 2002/0163057 A1 | | 11/2002 | Bulovic et al. | |
| 2004/0027849 A1 | | 2/2004 | Yang et al. | |
| 2004/0227136 A1 | | 11/2004 | Lan et al. | |
| 2005/0211978 A1 | * | 9/2005 | Bu et al. | 257/40 |
| 2005/0227108 A1 | * | 10/2005 | Lewis et al. | 428/690 |
| 2007/0058426 A1 | * | 3/2007 | Sokolik et al. | 365/174 |
| 2007/0181874 A1 | * | 8/2007 | Prakash et al. | 257/40 |
| 2007/0264524 A1 | * | 11/2007 | Gessner et al. | 428/690 |

FOREIGN PATENT DOCUMENTS

JP 62-095882 5/1987
WO WO 2005098988 A1 * 10/2005

OTHER PUBLICATIONS

Huang, H.G., et al. "Internal Photoemission in Polyaniline Revealed by Photoelectrochemistry." Synth. Met., vol. 123 (2001): pp. 321-325.*
Li, F., et al. "Fabrication and Electroluminescence of Double-Layered Organic Light-Emitting Diodes With the Al2O3/Al Cathode." Appl. Phys. Lett., vol. 70 (1997): pp. 1233-1235.*

(Continued)

*Primary Examiner* — Matthew W Such
(74) *Attorney, Agent, or Firm* — Harness, Dickey & Pierce, PLC

(57) ABSTRACT

Disclosed herein are an organic memory device and a method for fabricating the memory device. The organic memory device may include a first electrode, a second electrode and an organic active layer between first and second electrodes, wherein the organic active layer is formed of a mixture of a conductive polymer and a metallocene compound. Because the organic memory device possesses decreased switching time, decreased operating voltage, decreased fabrication costs and increased reliability, the organic memory device may be used as a highly integrated large-capacity memory device.

28 Claims, 3 Drawing Sheets

OTHER PUBLICATIONS

Li, F., et al. "Fabrication and Electroluminescence of Double-Layered Organic Light-Emitting Diodes With the Al2O3/Al Cathode." Appl. Phys. Lett., vol. 70 (1997): pp. 1233-1235.*

Shaheen, S.E., et al. "Energy and Charge Transfer in Organic Light-Emitting Diodes: A Soluble Quinacridone Study." J. Appl. Phys., vol. 85, No. 11 (Jun. 1, 1999): pp. 7939-7945.*

Chandrasekhar, P. Conducting Polymers, Fundamentals and Applications. Kluwer Academic Publishers: Boston (1999): pp. 383-386.*

Bradley, C.A., et al. "Synthesis and Characterization of Zirconium and Iron Complexes Containing Substituted Indenyl Ligands: Evaluation of Steric and Electronic Parameters." Organomet., vol. 23 (2004): pp. 5332-5346.*

* cited by examiner

RESISTIVE ORGANIC MEMORY DEVICE AND FABRICATION METHOD THEREOF

PRIORITY STATEMENT

This non-provisional application claims priority under 35 U.S.C. §119 to Korean Patent Application No. 2006-17154, filed on Feb. 22, 2006, in the Korean Intellectual Property Office (KIPO), the entire contents of which are herein incorporated by reference.

BACKGROUND

1. Field

Example embodiments relate to a resistive organic memory device and a method for fabricating the memory device. Other example embodiments relate to an organic memory device comprising an organic active layer formed of a mixture of a conductive polymer and a metallocene compound, and a method for fabricating the organic memory device.

2. Description of the Related Art

With the recent dramatic developments in digital communication technology, demand for a variety of memory devices has been increasing rapidly. In particular, memory devices suitable for use in applications including, for example, portable computers and electronic devices including mobile terminals, smart cards, electronic money, digital cameras, personal digital assistants (PDAs), digital audio players and/or multimedia players, are required for retaining data in memory even when no power is being applied to the memory device, thereby tending to reduce the memory-related power consumption of the device.

Conventional memory devices may include a bistable element that may be switched between a higher resistance state and a lower resistance state when a voltage is applied to the devices. Resistive memory devices are memories whose resistance is varied depending on an applied voltage and in which data is stored in response to changes in the resistance.

Chalcogenide materials, semiconductors and various types of oxides and nitrides are known to have resistive memory properties. Some organic materials are also found to have resistive memory properties. Of these resistive memory devices, organic memory devices may include an upper electrode, a lower electrode and a memory layer between the first and second electrodes wherein the memory layer is formed of an organic material and memory properties are realized by using bistability of resistance values obtained when a voltage is applied between the upper and lower electrodes. Next-generation organic memory devices ensure non-volatility, which is an advantage of conventional flash memories, and at the same time, overcome the disadvantages of undesirable processability, increased fabrication costs and decreased degree of integration.

One example of such an organic memory device utilizes 7,7,8,8-tetracyano-p-quinodimethane (CuTCNQ), which is an organometallic charge transfer complex compound, as the organic material. Another example includes semiconductor devices including an upper electrode, a lower electrode and an intermediate layer between the upper and lower electrodes, wherein the intermediate layer is formed from a mixture of an ionic salt, e.g., NaCl or CsCl, and a conductive polymer.

Other work has suggested organic memory devices including organic active layers and a metal nanocluster applied between the organic active layers, but efforts in this area have been hampered by low yields, difficulties in forming suitable metal nanoclusters, and reset voltages of about 0 V, rendering such devices generally unsuitable for widespread use as a nonvolatile organic memory.

Various materials have been investigated due to their potential use as materials for organic active layers of organic memory devices. Other work has suggested organic memory devices including an upper electrode, a lower electrode and a selectively conductive media between the two electrodes wherein the selectively conductive media contains an organic layer and a passive layer and the organic layer is composed of a conjugated organic material.

Metallocenes and their derivatives are currently being investigated for their inherent electrical, optical and magnetic properties, for example, their ability to be oxidized to form mixed valent states. However, a major portion of research on metallocenes and their derivatives has been devoted to their use as fuel additives and polymerization catalysts. There hasn't been any research on the use of metallocenes and their derivatives as materials for active layers of organic memory devices.

SUMMARY

Example embodiments are provided below for addressing certain of the deficiencies and/or limitations of prior art memory devices through the manufacture and use of highly integrated large-capacity organic memory devices including a conductive polymer and a metallocene compound that possesses the advantages of decreased switching time, decreased operating voltage, decreased fabrication costs and increased reliability.

Example embodiments also provide a method for fabricating an organic memory device by which an organic memory device may be fabricated by a simplified procedure at reduced costs and processed at lower temperatures so that it may be applied to flexible memory devices.

In accordance with example embodiments, there is provided an organic memory device including a first electrode, a second electrode and an organic active layer between the first and second electrodes, wherein the organic active layer is formed of a mixture of a conductive polymer and a metallocene compound of Formula 1 below:

$$CpMCp' \qquad (1)$$

wherein Cp and Cp' are each independently cyclopentadienyl or indenyl which is unsubstituted or substituted with at least one substituent selected from R and OR (in which each R, which may be identical or different, is a hydrogen atom, $C_{1-20}$ alkyl, $C_{3-20}$ cycloalkyl, $C_{5-30}$ heterocycloalkyl, $C_{2-20}$ alkenyl, $C_{6-20}$ aryl, $C_{5-30}$ heteroaryl, $C_{7-20}$ arylalkyl or $C_{7-30}$ heteroarylalkyl); and M is Fe, Ru or Zr.

The metallocene compound may have a structure represented by the following Formula 2 or 3:

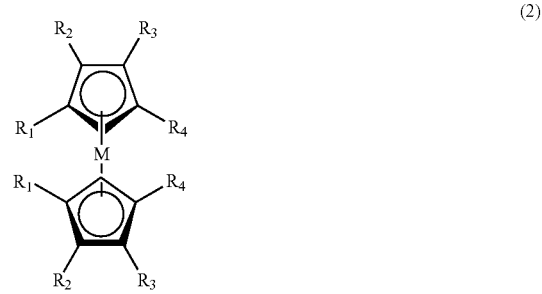

(2)

wherein $R_1$ to $R_4$, which may be identical to or different from each other, are independently a hydrogen atom, $C_{1-20}$ alkyl, $C_{3-20}$ cycloalkyl, $C_{5-30}$ heterocycloalkyl, $C_{2-20}$ alkenyl, $C_{6-20}$ aryl, $C_{5-30}$ heteroaryl, $C_{7-20}$ arylalkyl or $C_{7-30}$ heteroarylalkyl, and M is Fe, Ru or Zr; or

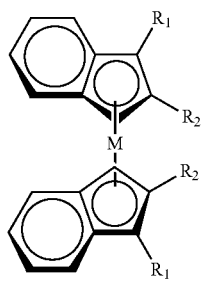

(3)

wherein $R_1$ and $R_2$, which may be identical to or different from each other, are independently a hydrogen atom, $C_{1-20}$ alkyl, $C_{3-20}$ cycloalkyl, $C_{5-30}$ heterocycloalkyl, $C_{2-20}$ alkenyl, $C_{6-20}$ aryl, $C_{5-30}$ heteroaryl, $C_{7-20}$ arylalkyl or $C_{7-30}$ heteroarylalkyl, and M is Fe, Ru or Zr.

The metallocene compound is a ferrocene compound represented by Formula 4 below:

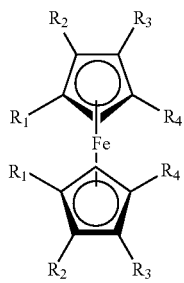

(4)

wherein $R_1$ to $R_4$, which may be identical to or different from each other, are independently a hydrogen atom, $C_{1-20}$ alkyl, $C_{3-20}$ cycloalkyl, $C_{5-30}$ heterocycloalkyl, $C_{2-20}$ alkenyl, $C_{6-20}$ aryl, $C_{5-30}$ heteroaryl, $C_{7-20}$ arylalkyl or $C_{7-30}$ heteroarylalkyl.

The conductive polymer used in example embodiments may be selected from the group consisting of polythiophene, polyvinylcarbazole, polyaniline, polypyrrole, polyphenylenevinylene, polyfluorene, and polyacetylene.

In accordance with example embodiments, there is provided a method for fabricating a memory device including forming a first electrode, a second electrode and an organic active layer between the first and second electrode, wherein the organic active layer using a mixture of a conductive polymer and a metallocene compound of Formula 1 below:

CpMCp'     (1)

wherein Cp and Cp' are each independently cyclopentadienyl or indenyl which is unsubstituted or substituted with at least one substituent selected from R and OR (in which each R, which may be identical or different, is a hydrogen atom, $C_{1-20}$ alkyl, $C_{3-20}$ cycloalkyl, $C_{5-30}$ heterocycloalkyl, $C_{2-20}$ alkenyl, $C_{6-20}$ aryl, $C_{5-30}$ heteroaryl, $C_{7-20}$ arylalkyl or $C_{7-30}$ heteroarylalkyl); and M is Fe, Ru or Zr.

In accordance with example embodiments, an organic active layer may include a mixture of a conductive polymer and a metallocene compound of Formula 1 below:

CpMCp'     (1)

wherein Cp and Cp' are each independently cyclopentadienyl or indenyl which is unsubstituted or substituted with at least one substituent selected from R and OR (in which each R, which is identical or different, is $C_{1-20}$ alkyl, $C_{3-20}$ cycloalkyl, $C_{5-30}$ heterocycloalkyl, $C_{2-20}$ alkenyl, $C_{6-20}$ aryl, $C_{5-30}$ heteroaryl, $C_{7-20}$ arylalkyl or $C_{7-30}$ heteroarylalkyl); and M is Fe, Ru or Zr.

BRIEF DESCRIPTION OF THE DRAWINGS

Example embodiments will be more clearly understood from the following detailed description taken in conjunction with the accompanying drawings.

FIG. 1 is a schematic cross-sectional view of an organic memory device according to example embodiments;

FIG. 2 is a schematic perspective view of a memory matrix employing a memory device according to example embodiments;

FIG. 3 is a graph showing the current-voltage characteristics of an organic memory device fabricated in Example 1;

FIG. 4 is a graph showing the resistance-voltage characteristics of an organic memory device fabricated in Example 1;

FIG. 5 is a graph illustrating the characteristics of an organic memory device fabricated in Example 1 of example embodiments during continuous switching of the memory device; and FIG. 6 is a graph showing the current-voltage characteristics of an organic memory device fabricated in Example 2.

DESCRIPTION OF EXAMPLE EMBODIMENTS

Figure 1:
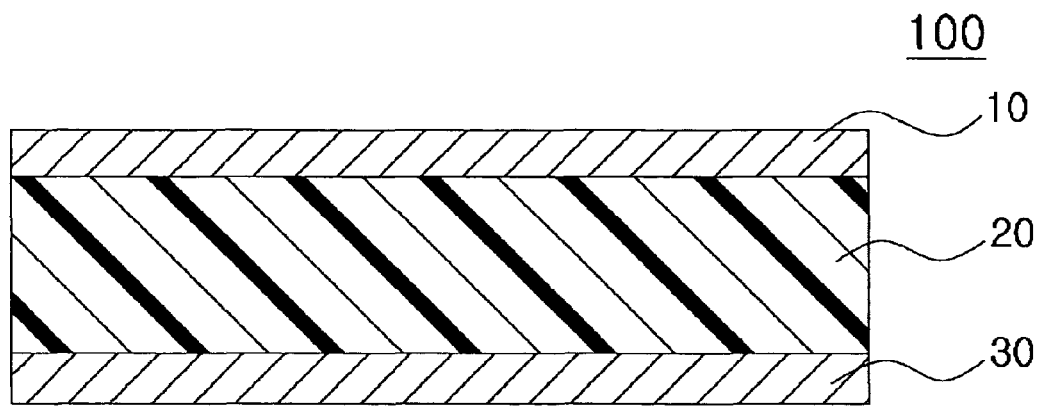
FIGS. 1-6 represent non-limiting, example embodiments as described herein.

Example embodiments will now be described in greater detail with reference to the accompanying drawings. In the drawings, the thicknesses of layers and regions may be exaggerated for clarity. Detailed illustrative example embodiments are disclosed herein. Specific structural and functional details disclosed herein are merely representative for purposes of describing example embodiments. Example embodiments may, however, be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments. Like numbers refer to like elements throughout the description of the figures.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between" and/or "adjacent" versus "directly adjacent").

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath", "below", "lower", "above", "upper" and the like, may be used herein for ease of description to describe one element or a feature's relationship to another element or feature as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments are related to an organic memory device including a first electrode, a second electrode and an organic active layer between the first and second electrodes, wherein the organic active layer is formed of a mixture of a conductive polymer and a metallocene compound. Organic active layers of organic memory devices may provide conductivity and bistability. The conductive polymer and the metallocene compound used in example embodiments may provide conductivity and bistability, respectively. The conductivity of the conductive polymer is varied depending on the oxidation and reduction states of the metallocene compound, and as a result, bistability may be realized.

FIG. 1 is a schematic cross-sectional view of an organic memory device according to example embodiments. With reference to FIG. 1, the organic memory device of example embodiments may include a first electrode 10, a second electrode 30 and an organic active layer 20 between the first and second electrodes 10 and 30. The resistance values of the organic active layer 20 obtained when a voltage is applied to the memory device 100 may show bistability, thus achieving memory properties of the memory device. The term "metallocene compound" herein is defined as an organometallic coordination compound having a sandwich structure similar to that of ferrocene. It is generally believed that a metal is n-bonded to the aromatic rings Cp and Cp' in the metallocene compound.

The conductive polymer may be a conjugated polymer and may have electron or hole conductivity due to its conjugated structure. The metallocene compound may have multiple oxidation states, which may be set by the application of a proper voltage. For example, a ferrocene compound is stable when it is in the $Fe^{2+}$ state, but is unstable when it is in the oxidized state (e.g. $Fe^{3+}$ state). The conductivity of the conductive polymer may be maintained when the ferrocene compound is in the $Fe^{2+}$ state, thus allowing the memory device to be in a lower resistance state. Because the ferrocene compound in the $Fe^{3+}$ state is unstable, the ferrocene compound has a tendency to return to the $Fe^{2+}$ state. The ferrocene compound in the $Fe^{3+}$ state may trap electrons of the conductive polymer, resulting in a decrease in the conductivity of the conductive polymer. As a result, the memory device may enter a higher resistance state. The conductivity of the conductive polymer varies depending on the difference in the reactivity of the metallocene compound acting as a dopant, thus achieving bistability. Further, the states are maintained even when no power is being applied to the memory device, thus ensuring non-volatility of the organic memory device.

When a proper electrical voltage is applied between the two electrodes of the memory device according to example embodiments, the organic active layer switches between a higher resistance state and a lower resistance state. Assuming that the lower resistance state is defined as data "1" and the higher resistance state is defined as data "0", two logic states of the data may be stored.

The metallocene compound used in example embodiments has a structure of Formula 1 below:

CpMCp'  (1)

wherein Cp and Cp' are each independently cyclopentadienyl or indenyl which is unsubstituted or substituted with at least one substituent selected from R and OR (in which each R, which may be identical or different, is a hydrogen atom, $C_{1-20}$ alkyl, $C_{3-20}$ cycloalkyl, $C_{5-30}$ heterocycloalkyl, $C_{2-20}$ alkenyl, $C_{6-20}$ aryl, $C_{5-30}$ heteroaryl, $C_{7-20}$ arylalkyl or $C_{7-30}$ heteroarylalkyl); and M is Fe, Ru or Zr.

In example embodiments, Cp and Cp' may be each independently selected from cyclopentadienyl and indenyl groups. As is well known to those skilled in the art, the indenyl group may be a phenyl group fused to a cyclopentadienyl ring. Specific examples of the alkyl group may include straight-chained or branched alkyl groups, e.g., methyl, ethyl, propyl, isobutyl, sec-butyl, tert-butyl, pentyl, iso-amyl and/or hexyl.

The term "heterocycloalkyl group" as used herein refers to a $C_5$-$C_{30}$ monovalent monocyclic system consisting of one to three heteroatoms selected from N, O, P and/or S atoms and the remaining ring carbon atoms. At least one hydrogen atom contained in the heterocycloalkyl group may be substituted.

The term "aryl" as used herein refers to a carbocyclic aromatic system including one or more aromatic rings in which the rings may be attached together in a pendent manner or may be fused. Specific examples of the aryl group may include aromatic groups, e.g., phenyl, naphthyl and/or tetrahydronaphthyl. At least one hydrogen atom contained in the aryl group may be substituted.

The term "heteroaryl" as used herein refers to a $C_5$-$C_{30}$ cyclic aromatic system consisting of one to three heteroatoms selected from N, O, P and/or S atoms and the remaining ring carbon atoms in which the rings may be attached together in a pendant manner or may be fused. At least one hydrogen atom contained in the heteroaryl group may be substituted.

The term "arylalkyl" as used herein refers to a group in which a part of hydrogen atoms contained in the aryl group defined above are substituted with lower alkyl radicals, e.g., methyl, ethyl and/or propyl. Examples of the arylalkyl group may include benzyl and/or phenylethyl. At least one hydrogen atom contained in the arylalkyl group may be substituted.

The term "heteroarylalkyl" as used herein refers to a group in which a part of hydrogen atoms contained in the heteroaryl group defined above are substituted with lower alkyl radicals, e.g., methyl, ethyl and propyl. At least one hydrogen atom contained in the heteroarylalkyl group may be substituted.

The term "cycloalkyl" as used herein refers to a $C_5$-$C_{30}$ monovalent monocyclic system. At least one hydrogen atom contained in the cycloalkyl group may be substituted.

Example metallocene compounds that may be used in example embodiments are those represented by Formulae 2 and 3 below:

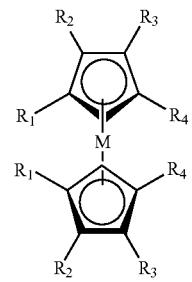

(2)

wherein $R_1$ to $R_4$, which may be identical to or different from each other, are independently a hydrogen atom, $C_{1-20}$ alkyl, $C_{3-20}$ cycloalkyl, $C_{5-30}$ heterocycloalkyl, $C_{2-20}$ alkenyl, $C_{6-20}$ aryl, $C_{5-30}$ heteroaryl, $C_{7-20}$ arylalkyl or $C_{7-30}$ heteroarylalkyl, and M is Fe, Ru or Zr; and

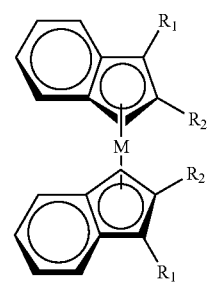

(3)

wherein $R_1$ and $R_2$, which may be identical to or different from each other, are independently a hydrogen atom, $C_{1-20}$ alkyl, $C_{3-20}$ cycloalkyl, $C_{5-30}$ heterocycloalkyl, $C_{2-20}$ alkenyl, $C_{6-20}$ aryl, $C_{5-30}$ heteroaryl, $C_{7-20}$ arylalkyl or $C_{7-30}$ heteroarylalkyl, and M is Fe, Ru or Zr.

In example embodiments, one or more hydrogen (H) atoms contained in the Cp or Cp' groups are replaced by R or OR, as shown in Formulae 2 and 3. Each R may be identical or different, and non-limiting examples thereof may include $C_{1-20}$ alkyl, $C_{3-20}$ cycloalkyl, $C_{5-30}$ heterocycloalkyl, $C_{2-20}$ alkenyl, $C_{6-20}$ aryl, $C_{5-30}$ heteroaryl, $C_{7-20}$ arylalkyl and $C_{7-30}$ heteroarylalkyl.

An example is a ferrocene compound of Formula 4 below:

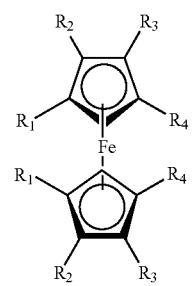

(4)

wherein $R_1$ to $R_4$, which may be identical to or different from each other, are independently a hydrogen atom, $C_{1-20}$ alkyl, $C_{3-20}$ cycloalkyl, $C_{5-30}$ heterocycloalkyl, $C_{2-20}$ alkenyl, $C_{6-20}$ aryl, $C_{5-30}$ heteroaryl, $C_{7-20}$ arylalkyl or $C_{7-30}$ heteroarylalkyl.

Examples of suitable conductive polymers as materials for the organic active layer may include polythiophene, polyvinylcarbazole, polyaniline, polypyrrole, polyphenylenevinylene, polyfluorene and/or polyacetylene. Specific examples of such conjugated polymers may include, but are not limited to, poly(3-hexylthiophene-2,5-diyl), poly(9-vinylcarbazole), polyaniline (emeraldine base), poly[2-methoxy-5-(2-ethylhexyloxy)-1,4-phenylenevinylene] and/or poly(9,9-didodecylfluorenyl-2,7-yleneethynylene).

The conductive polymer and the metallocene compound constituting the organic active layer are mixed in a ratio ranging from about 99:1 to about 60:40, for example, from about 70:30 to about 95:5. The organic memory device of example embodiments may be fabricated on a substrate. As the substrate, a common organic or inorganic substrate may be used, and for example, a flexible substrate may also be used. Examples of suitable materials for the substrate may include, but are not limited to, glass, silicon, surface-modified glass, polypropylene, activated acrylamide ceramics, membranes, gels and/or aerogels.

The first electrode 10 and the second electrode 30 may be made of at least one electrically conductive material selected from the group consisting of metals, metal alloys, metal nitrides, metal oxides, metal sulfides, organic conductors, nanostructures and/or crystals. Specific examples of materials for the electrodes may include, but are not limited to, gold, silver, platinum, copper, cobalt, nickel, tin, titanium, tungsten, aluminum and/or indium tin oxide.

The organic memory device of example embodiments may further include a barrier layer formed under the first electrode or on the second electrode to prevent or reduce damage to the first or second electrode due to attacks by the organic material. The barrier layer may be formed of a material selected from the group consisting of $SiO_x$, $AlO_x$, $NbO_x$, $TiO_x$, $CrO_x$, $VO_x$, $TaO_x$, $CuO_x$, $MgO_x$, $WO_x$ and/or $AlNO_x$, and may be formed of a material selected from the group consisting of $SiO_2$, $Al_2O_3$, $Cu_2O$, $TiO_2$ and/or $V_2O_3$. The barrier layer may also be formed of an organic material, e.g., Alq3, polymethylmethacrylate, polystyrene and/or PET. The barrier layer may have a thickness of about 20 Å to about 300 Å.

Figure 2:
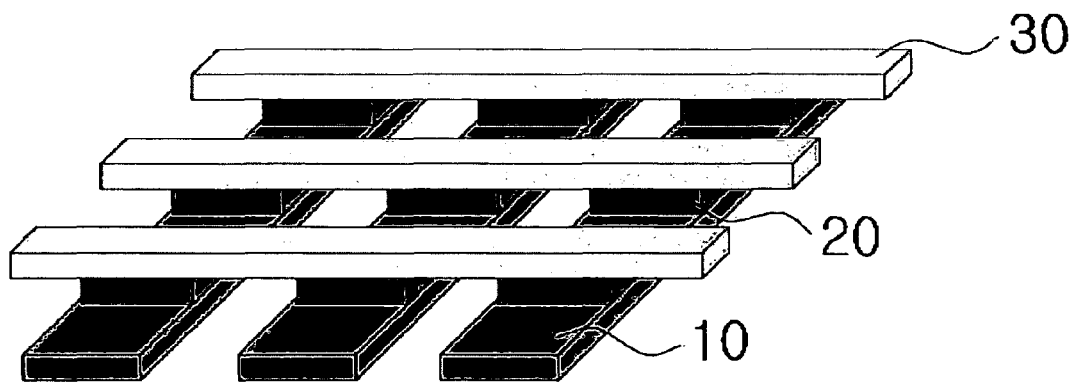

FIG. 2 is a schematic perspective view of an example memory matrix employing the memory device of example embodiments. As shown in FIG. 2, the memory matrix may be formed on a suitable substrate, e.g., a glass and/or silicon substrate. With this configuration of the memory matrix, a plurality of cells may be formed at intersections between first electrodes 10 and second electrodes 30. The cells thus formed may provide bistability characteristics.

The organic memory device of example embodiments may be well suited for use in computers, portable information devices, cell phones, medical devices, radar devices and/or satellite devices. The reduction in size and weight of the organic memory device of example embodiments may improve the portability of portable digital devices, including cell phones, PDAs, notebook computers, digital cameras, portable multimedia players and/or DMB terminals.

Example embodiments are related to a method for fabricating an organic memory device using the conductive polymer and the metallocene compound. The organic memory device fabricated by the method of example embodiments may include a first electrode, a second electrode and an organic active layer between the first and second electrodes, wherein the organic active layer may be formed using a mixture of a conductive polymer and a metallocene compound. Materials for a substrate, the electrodes and the organic active layer may be as explained above.

Coating processes for the formation of the organic active layer using a mixture of the conductive polymer and the metallocene compound may not be particularly limited, and examples thereof may include spin casting, spin coating, spray coating, electrostatic coating, dip coating, blade coating, roll coating and/or ink-jet printing. The organic active layer may have a thickness of about 50 Å to about 3,000 Å.

Any solvent that may dissolve the conductive polymer and the metallocene compound may be used for spin coating. At least one solvent selected from the group consisting of chloroform, N-methylpyrrolidone, acetone, cyclopentanone, cyclohexanone, methyl ethyl ketone, ethyl cellosolve acetate, butyl acetate, ethylene glycol, toluene, xylene, tetrahydrofuran, dimethylformamide, chlorobenzene, acetonitrile and mixtures thereof may be used to form the organic active layer by spin coating. A solvent system or solvent mixture of two or more of these solvents in any miscible ratio may also be used.

A baking process may be performed after a coating process. Baking processes may be suitably selected according to the solvent used. The baking may be preformed on a hot plate for about 10 minutes or more taking into consideration the boiling point of the coating solvent. The organic active layer may be formed into a monolayer and/or a multilayer. The multilayer structure of the organic active layer may be formed by alternately coating a solution of the conductive polymer and a solution of the metallocene compound on the second electrode. The first and second electrodes may be formed by known coating processes, including deposition (e.g., thermal evaporation), sputtering, e-beam evaporation and/or spin coating.

Hereinafter, example embodiments will be explained in more detail with reference to the following examples. However, these examples are given for the purpose of illustration and are not to be construed as limiting the scope of example embodiments.

EXAMPLES

Example 1

Al was deposited to a thickness of about 80 nm on a glass substrate (about 50 mm×about 50 mm) by thermal evaporation to form a lower electrode. About 8.4 mg of poly(3-hexylthiophene-2,5-diyl) (Aldrich Co.) as a conductive conjugated polymer and about 3.6 mg of the ferrocene compound of Formula 4 (Aldrich Co.) as a redox material were dissolved in about 1 ml of chloroform ($CHCl_3$) by sonication for about 15 minutes. The resulting solution was passed through a syringe filter (pore size: about 0.2 μm) made of PTFE, and spin-coated at about 2,000 rpm on the lower substrate for about 20 seconds. The remaining solvent was removed by baking the coated substrate on a hot plate at about 65° C. for about 10 minutes to form an organic active layer. Cu was then deposited on the organic active layer to a thickness of about 80 nm by thermal evaporation, patterned and etched to form an upper electrode, thereby completing fabrication of example embodiments of organic memory devices. During fabrication of this organic memory device, the thickness of the organic active layer was controlled within about 70 nm to about 80 nm, as measured using an Alpha-Step™ profilometer. The thickness of the deposited electrodes was controlled using a quartz crystal monitor.

Example 2

Figure 4:
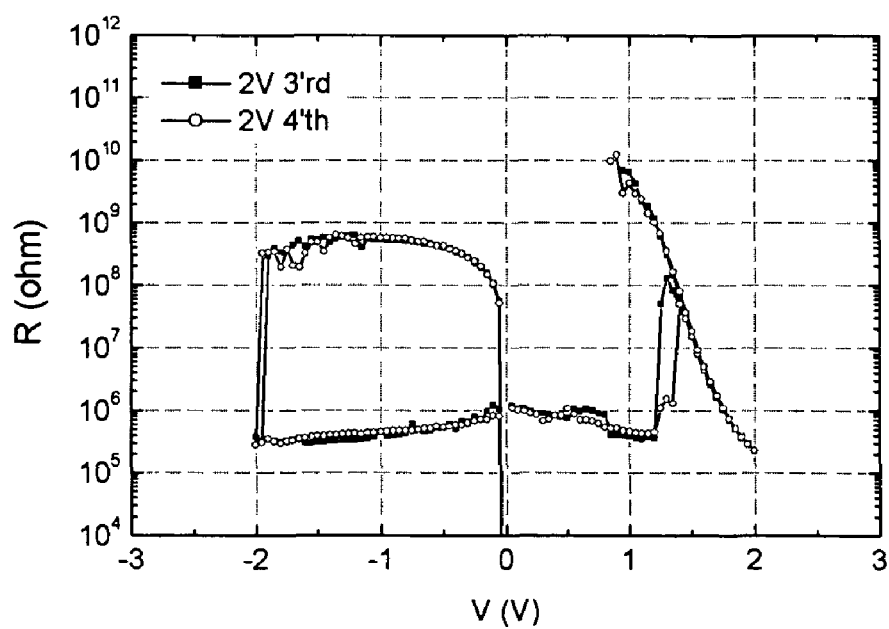

A device was fabricated in the same manner as in Example 1, with the exception that about 8.4 mg of poly(9-vinylcarbazole) (Aldrich Co.) as a conductive polymer and about 3.6 mg of ferrocene were dissolved in about 1 ml of chloroform (CHCl$_3$). The V-I characteristics of the device were measured, and the results are shown in FIG. 4.

Test Example 1

Figure 3:
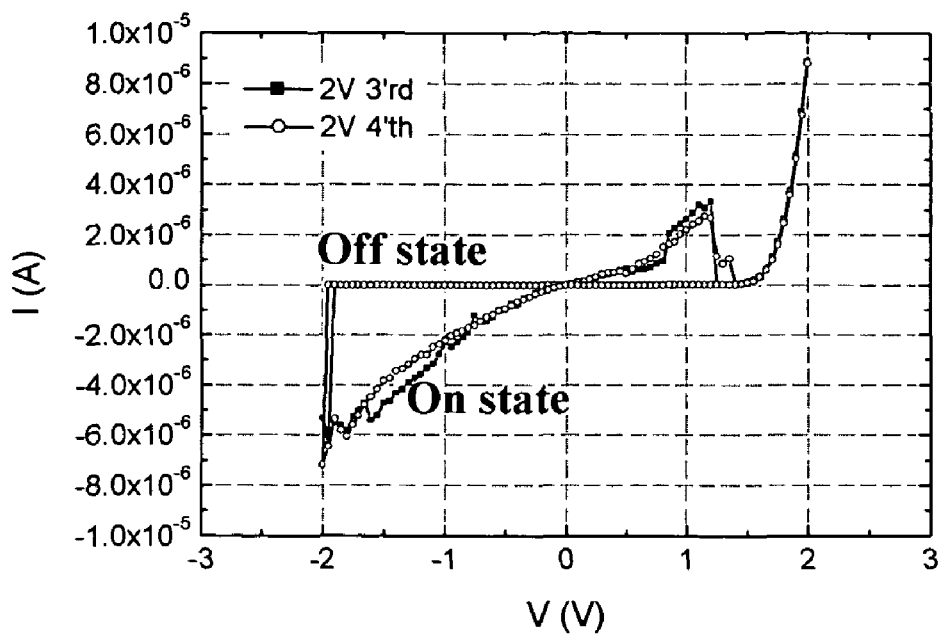
Figure 5:
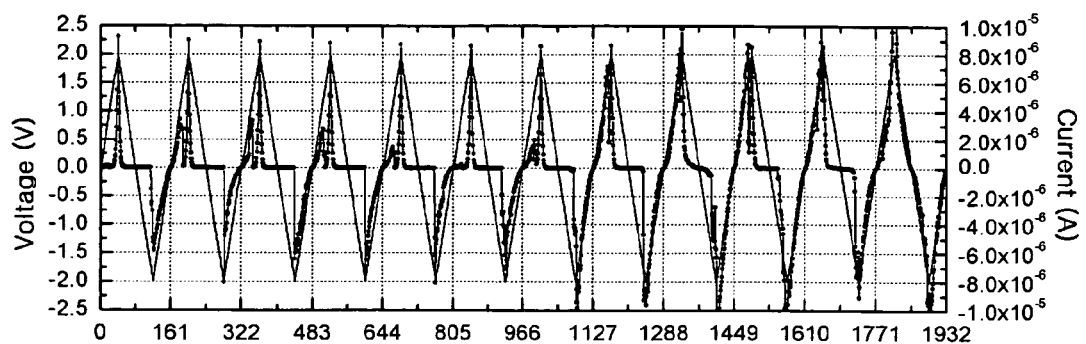

The electrical properties of the test device fabricated in Example 1 were evaluated using a Keithley 2400 Source Meter. The results are shown in FIGS. 3 and 4. FIGS. 3 and 4 are graphs showing the current-voltage characteristics and resistance-voltage characteristics of the device, respectively. A voltage was applied to the device at a sweep speed of about 5 mV/s from about +1/−1 V to about +5/−5V. The switching cycles of the device were measured during continuous application of the voltage. The results are shown in FIG. 5.

Referring to FIG. 3, the device was in a reset state in which the current sharply decreased in a voltage range of about 1 V to about 1.5 V. It could be confirmed from the graph shown in FIG. 4 that the resistance increased from about $10^5$ ohm to about $10^8$ ohm by about three orders of magnitude. Meanwhile, the device was in a set state in which the current sharply increased at about −2 V. The obtained resistance values remained substantially unchanged at two continuous measurements.

Referring to FIG. 3, the device showed two conducting states when the voltage was swept in both directions. Where sweeping was carried out by the application of a positive voltage, the device was in a higher resistance state (e.g. an "OFF" state). Where a negative bias voltage was applied, the device was switched into a lower resistance state (e.g. an "ON" state). This switching phenomenon was repetitively observed in continuous eleven cycles. The results are shown in FIG. 5. The reset state, where the current sharply increased in a voltage range of about 1.5 V-about 2 V, shown in FIG. 3 may occur due to the characteristics of the conductive polymer, e.g. the current may increase non-linearly with increasing voltage.

Figure 6:
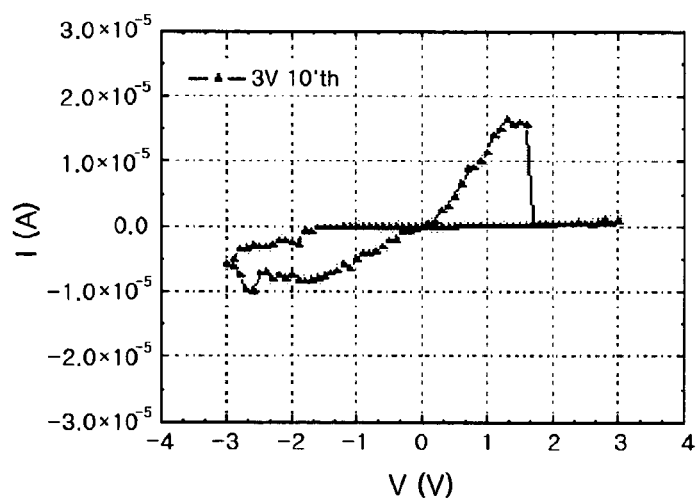

FIG. 6 shows the current-voltage characteristics of the organic memory device fabricated in Example 2. Referring to FIG. 6, a reset state of the device was steeply changed at a voltage of about 1.5 V, whereas a set state of the device was observed without any steep switching in a voltage range of about −2 V to about −3 V. A non-linear increase in current was not observed in the reset state in the graph of FIG. 6, unlike in the graph of FIG. 3. These results indicate that the conductivity of poly(9-vinylcarbazole) used in Example 2 may be lower than that of poly(3-hexylthiophene-2,5-diyl) used in Example 1.

The organic memory device of example embodiments may offer miniaturization, decreased switching time, decreased operating voltage, decreased fabrication costs and increased reliability, when compared to inorganic memory devices. Based on these advantages, the organic memory device of example embodiments may be used as a light-weight, highly integrated, large-capacity memory device.

In addition, the organic memory device of example embodiments may be fabricated by a simpler and economical process, e.g., spin casting and/or spin coating, may be processed at lower temperatures and may be applied to flexible memory devices.

Although example embodiments have been disclosed for illustrative purposes, those skilled in the art will appreciate that various modifications and variations are possible, without departing from the scope and spirit of the appended claims. Accordingly, such modifications and variations are intended to come within the scope of the claims.

What is claimed is:

1. An organic active layer comprising:
   a mixture of a conductive polymer and a metallocene compound of Formula 1 below:

$$CpMCp' \qquad (1)$$

wherein Cp and Cp' are each independently one of cyclopentadienyl and indenyl which is one of unsubstituted and substituted with at least one substituent selected from R and OR, in which each R, which is one of identical and different, is one of $C_{1-20}$ alkyl, $C_{3-20}$ cycloalkyl, $C_{5-30}$ heterocycloalkyl, $C_{2-20}$ alkenyl, $C_{6-20}$ aryl, $C_{5-30}$ heteroaryl, $C_{7-20}$ arylalkyl and $C_{7-30}$ heteroarylalkyl, M is Zr, and the organic active layer is a bistable element configured to switch between a high resistance state and a low resistance state based on an applied voltage.

2. The organic active layer according to claim 1, wherein the metallocene compound is represented by one of formulas 2 and 3 below:

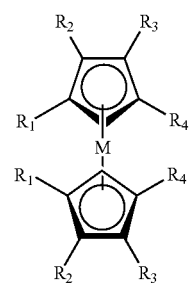

(2)

wherein $R_1$ to $R_4$, which are one of identical to and different from each other, are independently one of a hydrogen atom, $C_{1-20}$ alkyl, $C_{3-20}$ cycloalkyl, $C_{5-30}$ heterocycloalkyl, $C_{2-20}$ alkenyl, $C_{6-20}$ aryl, $C_{5-30}$ heteroaryl, $C_{7-20}$ arylalkyl and $C_{7-30}$ heteroarylalkyl, and M is Zr; or

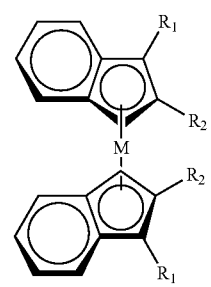

(3)

wherein $R_1$ and $R_2$, which are one of identical to and different from each other, are independently one of a hydrogen atom, $C_{1-20}$ alkyl, $C_{3-20}$ cycloalkyl, $C_{5-30}$ heterocycloalkyl, $C_{2-20}$ alkenyl, $C_{6-20}$ aryl, $C_{5-30}$ heteroaryl, $C_{7-20}$ arylalkyl and $C_{7-30}$ heteroarylalkyl, and M is Zr.

3. The organic active layer according to claim 1, wherein the conductive polymer is selected from the group consisting of polythiophene, polyvinylcarbazole, polyaniline, polypyrrole, polyphenylenevinylene, polyfluorene, and polyacetylene.

4. The organic active layer according to claim 3, wherein the conductive polymer is selected from the group consisting of poly(3-hexylthiophene-2,5-diyl), poly(9-vinylcarbazole), emeraldine base polyaniline, poly[2-methoxy-5-(2-ethylhexyloxy)-1,4-phenylenevinylene], and poly(9,9-didodecylfluorenyl-2,7-yleneethynylene).

5. The organic active layer according to claim 1, wherein the conductive polymer and the metallocene compound are mixed in a ratio ranging from about 99:1 to about 60:40.

6. The organic active layer according to claim 5, wherein the conductive polymer and the metallocene compound are mixed in a ratio ranging from about 70:30 to about 95:5.

7. An organic memory device, comprising:
a first electrode;
a second electrode; and
an organic active layer between the first and second electrodes,
wherein the organic active layer is formed of a mixture of a conductive polymer and a metallocene compound of Formula 1 below:

CpMCp'    (1), wherein Cp and Cp' are each independently one of cyclopentadienyl and indenyl which is one of unsubstituted and substituted with at least one substituent selected from R and OR in which each R, which is one of identical and different, is one of $C_{1-20}$ alkyl, $C_{3-20}$ cycloalkyl, $C_{6-30}$ heterocycloalkyl, $C_{2-20}$ alkenyl, $C_{6-20}$ aryl, $C_{5-30}$ heteroaryl, $C_{7-20}$ arylalkyl and $C_{7-30}$ heteroarylalkyl, M is Zr, and the organic active layer is a bistable element configured to switch between a high resistance state and a low resistance state based on an applied voltage.

8. The organic memory device according to claim 7, wherein the metallocene compound is represented by one of formulas 2 and 3 below:

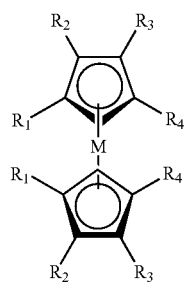

(2)

wherein $R_1$ to $R_4$, which are one of identical to and different from each other, are independently one of a hydrogen atom, $C_{1-20}$ alkyl, $C_{3-20}$ cycloalkyl, $C_{5-30}$ heterocloalkyl, $C_{2-20}$ alkenyl, $C_{6-20}$ aryl, $C_{5-30}$ heteroaryl, $C_{7-20}$ arylalkyl and $C_{7-30}$ heteroarylalkyl, and M is Zr; or

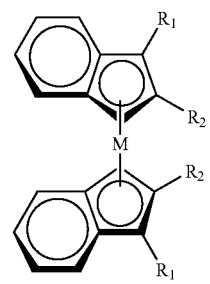

(3)

wherein $R_1$ and $R_2$, which are one of identical to and different from each other, are independently one of a hydrogen atom, $C_{1-20}$ alkyl, $C_{3-20}$ cycloalkyl, $C_{5-30}$ heterocycloalkyl, $C_{2-20}$ alkenyl, $C_{6-20}$ aryl, $C_{5-30}$ heteroaryl, $C_{7-20}$ arylalkyl and $C_{7-30}$ heteroarylalkyl, and M is Zr.

9. The organic memory device according to claim 7, wherein the conductive polymer is selected from the group consisting of polythiophene, polyvinylcarbazole, polyaniline, polypyrrole, polyphenylenevinylene, polyfluorene, and polyacetylene.

10. The organic memory device according to claim 9, wherein the conductive polymer is selected from the group consisting of poly(3-hexylthiophene-2,5-diyl), poly(9-vinylcarbazole), emeraldine base polyaniline, poly[2-methoxy-5-(2-ethylhexyloxy)-1,4-phenylenevinylene], and poly(9,9-didodecylfluorenyl-2,7-yleneethynylene).

11. The organic memory device according to claim 7, wherein the conductive polymer and the metallocene compound are mixed in a ratio ranging from about 99:1 to about 60:40.

12. The organic memory device according to claim 11, wherein the conductive polymer and the metallocene compound are mixed in a ratio ranging from about 70:30 to about 95:5.

13. The organic memory device according to claim 7, wherein the first electrode and the second electrode are made of at least one material selected from the group consisting of metals, metal alloys, metal nitrides, metal oxides, metal sulfides, organic conductors, nanostructures, and crystals.

14. The organic memory device according to claim 13, wherein the first electrode and the second electrode are made of at least one material selected from the group consisting of gold, silver, platinum, copper, cobalt, nickel, tin, titanium, tungsten, aluminum, and indium tin oxide.

15. The organic memory device according to claim 7, further comprising:
a barrier layer one of under the first electrode and on the second electrode.

16. The organic memory device according to claim 15, wherein the barrier layer is one of an inorganic material selected from the group consisting of $SiO_x$, $AlO_x$, $NbO_x$, $TiO_x$, $CrO_x$, $VO_x$, $TaO_x$, $CuO_x$, $MgO_x$, $WO_x$ and $AlNO_x$, LiF and an organic material selected from the group consisting of Alq3, polymethylmethacrylate, polystyrene and PET.

17. The organic memory device according to claim 16, wherein the barrier layer is an inorganic material selected from the group consisting of $SiO_2$, $Al_2O_3$, $Cu_2O$, $TiO_2$ and $V_2O_3$.

18. A method for fabricating a memory device comprising:
forming a first electrode, a second electrode and an organic active layer between the first and second electrodes on a substrate, wherein the organic active layer includes a mixture of a conductive polymer and a metallocene compound of Formula 1 below:

CpMCp'  (1), wherein Cp and Cp' are each independently one of cyclopentadienyl and indenyl which is one of unsubstituted and substituted with at least one substituent selected from R and OR, in which each R, which is one of identical and different, is one of $C_{1-20}$ alkyl, $C_{3-20}$ cycloalkyl, $C_{5-30}$ heterocycloalkyl, $C_{2-20}$ alkenyl, $C_{6-20}$ aryl, $C_{5-30}$ heteroaryl, $C_{7-20}$ arylalkyl and $C_{7-30}$ heteroarylalkyl, M is Zr, and the organic active layer is a bistable element configured to switch between a high resistance state and a low resistance state based on an applied voltage.

19. The method according to claim 18, wherein the metallocene compound is represented by one of Formula 2 and 3 below:

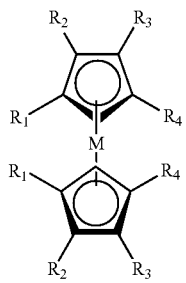

(2)

wherein $R_1$ to $R_4$, which are one of identical to and different from each other, are independently one of a hydrogen atom, $C_{1-20}$ alkyl, $C_{3-20}$ cycloalkyl, $C_{5-30}$ heterocycloalkyl, $C_{2-20}$ alkenyl, $C_{6-20}$ aryl, $C_{5-30}$ heteroaryl, $C_{7-20}$ arylalkyl and $C_{7-30}$ heteroarylalkyl, and M is Zr; or

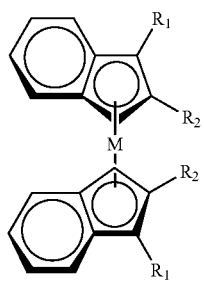

(3)

wherein $R_1$ and $R_2$, which are one of identical to and different from each other, are independently one of a hydrogen atom, $C_{1-20}$ alkyl, $C_{3-20}$ cycloalkyl, $C_{5-30}$ heterocycloalkyl, $C_{2-20}$ alkenyl, $C_{6-20}$ aryl, $C_{5-30}$ heteroaryl, $C_{7-20}$ arylalkyl and $C_{7-30}$ heteroarylalkyl, and M is Zr.

20. The method according to claim 18, wherein the conductive polymer is selected from the group consisting of polythiophene, polyvinylcarbazole, polyaniline, polypyrrole, polyphenylenevinylene, polyfluorene, and polyacetylene.

21. The method according to claim 18, wherein the conductive polymer is selected from the group consisting of poly(3-hexylthiophene-2,5-diyl), poly(9-vinylcarbazole), emeraldine base polyaniline, poly[2-methoxy-5-(2-ethylhexyloxy)-1,4-phenylenevinylene], and poly(9,9-didodecylfluorenyl-2,7-yleneethynylene).

22. The method according to claim 18, wherein the conductive polymer and the metallocene compound are mixed in a ratio ranging from about 99:1 to about 60:40.

23. The method according to claim 22, wherein the conductive polymer and the metallocene compound are mixed in a ratio ranging from about 70:30 to about 95:5.

24. The method according to claim 18, wherein the organic active layer is formed by a coating process selected from the group consisting of spin casting, spin coating, spray coating, electrostatic coating, dip coating, blade coating, and roll coating.

25. The method according to claim 24, wherein the coating is performed using at least one solvent selected from the group consisting of chloroform, N-methylpyrrolidone, acetone, cyclopentanone, cyclohexanone, methyl ethyl ketone, ethyl cellosolve acetate, butyl acetate, ethylene glycol, toluene, xylene, tetrahydrofuran, dimethylformamide, chlorobenzene, and acetonitrile.

26. The method according to claim 18, wherein the first electrode and the second electrode are made of at least one material selected from the group consisting of metals, metal alloys, metal nitrides, metal oxides, metal sulfides, organic conductors, nanostructures, and crystals.

27. The method according to claim 18, further comprising: forming a barrier layer one of under the first electrode and on the second electrode.

28. An organic memory device, comprising:
a first electrode;
a second electrode; and
an organic active layer between the first and second electrodes,
wherein the organic active layer is formed of a mixture of a conductive polymer and a metallocene compound of Formula 1 below:

CpMCp'  (1), wherein Cp and Cp' are indenyl which is one of unsubstituted and substituted with at least one substituent selected from R and OR in which each R, which is one of identical and different, is one of C1-20 alkyl, C3-20 cycloalkyl, C5-30 heterocycloalkyl, C2-20 alkenyl, C6-20 aryl, C5-30 heteroaryl, C7-20 arylalkyl and C7-30 heteroarylalkyl, and M is Zr.

* * * * *